(12) United States Patent
Li et al.

(10) Patent No.: US 8,795,559 B2
(45) Date of Patent: Aug. 5, 2014

(54) METHOD FOR FORMING IMAGERS

(75) Inventors: Jin Li, Boise, ID (US); Ulrich C. Boettiger, Boise, ID (US)

(73) Assignee: Micron Technology, Inc., Boise, ID (US)

(*) Notice: Subject to any disclaimer, the term of this patent is extended or adjusted under 35 U.S.C. 154(b) by 121 days.

(21) Appl. No.: 13/589,492

(22) Filed: Aug. 20, 2012

(65) Prior Publication Data
US 2012/0315720 A1 Dec. 13, 2012

Related U.S. Application Data

(60) Continuation of application No. 11/041,406, filed on Jan. 25, 2005, now abandoned, which is a division of application No. 10/681,308, filed on Oct. 9, 2003, now Pat. No. 7,227,692.

(51) Int. Cl.
*B29D 11/00* (2006.01)
(52) U.S. Cl.
USPC .......................................................... 264/1.7
(58) Field of Classification Search
CPC ........... B29D 11/00365; G02B 3/0018; G02B 3/0043; G02B 3/0056; H01L 27/14627; H01L 27/14685
USPC ............. 264/1.7; 437/2, 3; 257/432, 440, 232
See application file for complete search history.

(56) References Cited

U.S. PATENT DOCUMENTS

| 5,074,649 A | 12/1991 | Hamanaka |
| 5,238,856 A | 8/1993 | Tokumitsu |
| 5,466,926 A | 11/1995 | Sasano et al. |
| 5,493,143 A | 2/1996 | Hokari |
| 5,536,455 A | 7/1996 | Aoyama et al. |
| 5,955,753 A | 9/1999 | Takahashi |
| 6,140,630 A | 10/2000 | Rhodes |
| 6,188,094 B1 | 2/2001 | Kochi et al. |
| 6,204,524 B1 | 3/2001 | Rhodes |
| 6,310,366 B1 | 10/2001 | Rhodes et al. |
| 6,326,652 B1 | 12/2001 | Rhodes |
| 6,333,205 B1 | 12/2001 | Rhodes |

(Continued)

FOREIGN PATENT DOCUMENTS

| JP | 11-186530 | 7/1999 |
| JP | 2000-260968 | 9/2000 |

OTHER PUBLICATIONS

Agranov, G. et al., "Crosstalk and Microlens Study in a Color CMOS Image Sensor", IEEE Transactions on Electron Devices, vol. 50, No. 1, Jan. 2003.

*Primary Examiner* — Joseph S Del Sole
*Assistant Examiner* — Erin Snelting
(74) *Attorney, Agent, or Firm* — Dickstein Shapiro LLP

(57) ABSTRACT

A micro-lens array with reduced or no empty space between individual micro-lenses and a method for forming same. The micro-lens array is formed by patterning a first set of micro-lens material in a checkerboard pattern on a substrate. The first set of micro-lens material is reflowed and cured into first micro-lenses impervious to subsequent reflows. Then, a second set of micro-lens material is patterned in spaces among the first micro-lenses, reflowed and cured into second micro-lenses. The reflows and cures can be conducted under different conditions, and the micro-lenses may be differently sized. The conditions of the reflows can be chosen to ensure that the focal lengths of micro-lenses are optimized for maximum sensor signal.

35 Claims, 10 Drawing Sheets

(56) References Cited

U.S. PATENT DOCUMENTS

| | | |
|---|---|---|
| 6,376,868 B1 | 4/2002 | Rhodes |
| 6,503,384 B1 * | 1/2003 | Teshima et al. ............... 205/118 |
| 6,611,036 B2 | 8/2003 | Assadi et al. |
| 6,643,386 B1 | 11/2003 | Foster |
| 6,734,031 B2 | 5/2004 | Shizukuishi |
| 6,737,719 B1 | 5/2004 | Yamamoto |
| 6,821,810 B1 * | 11/2004 | Hsiao et al. ..................... 438/69 |
| 6,829,087 B2 | 12/2004 | Freese et al. |
| 6,852,591 B2 | 2/2005 | Rhodes |
| 6,947,088 B2 | 9/2005 | Kochi |
| 7,053,952 B2 | 5/2006 | Tsuboi |
| 7,110,034 B2 | 9/2006 | Suda |
| 7,227,692 B2 | 6/2007 | Boettiger et al. |
| 2001/0042876 A1 * | 11/2001 | Wester ........................ 257/292 |
| 2002/0140832 A1 | 10/2002 | Summa |
| 2002/0176037 A1 * | 11/2002 | Li .................................. 349/95 |
| 2003/0111700 A1 * | 6/2003 | Bencuya ...................... 257/432 |
| 2003/0196903 A1 * | 10/2003 | Teshima et al. ............... 205/118 |
| 2003/0215967 A1 * | 11/2003 | Shizukuishi .................... 438/22 |
| 2004/0223071 A1 | 11/2004 | Wells et al. |
| 2004/0246351 A1 | 12/2004 | Hiatt et al. |
| 2004/0263985 A1 | 12/2004 | Boettiger |
| 2006/0119950 A1 * | 6/2006 | Boettiger et al. ............. 359/626 |
| 2007/0145419 A1 * | 6/2007 | Park ............................. 257/223 |
| 2007/0145441 A1 * | 6/2007 | Hwang ........................ 257/291 |
| 2007/0153107 A1 * | 7/2007 | Boettiger et al. ............. 348/273 |
| 2008/0192357 A1 * | 8/2008 | Boettiger et al. ............. 359/626 |
| 2012/0298842 A1 * | 11/2012 | Arase et al. ................ 250/208.1 |

* cited by examiner

METHOD FOR FORMING IMAGERS

CROSS-REFERENCE TO RELATED APPLICATION

The present application is a continuation application of U.S. patent application Ser. No. 11/041,406, filed Jan. 25, 2005 now abandoned, which is a divisional application of U.S. patent application Ser. No. 10/681,308, filed on Oct. 9, 2003, now U.S. Pat. No. 7,227,692, issued Jun. 5, 2007, the disclosures of which are incorporated herein by reference in their entirety.

FIELD OF THE INVENTION

The present invention relates generally to the field of semiconductor-based imager devices using micro-lenses, and more particularly to the fabrication of an array of micro-lenses.

BACKGROUND

The semiconductor industry currently uses different types of semiconductor-based imagers, such as charge coupled devices (CCDs), CMOS active pixel sensors (APS), photodiode arrays, charge injection devices and hybrid focal plane arrays, among others, that use an array of micro-lenses. Semiconductor-based displays using micro-lenses are also being developed.

Micro-lenses may be formed through either a subtractive or an additive process. In the additive process, a lens material is formed on a substrate and subsequently is formed into a micro-lens shape.

In conventional additive micro-lens fabrication, an intermediate material is deposited in an array onto a substrate and formed into a micro-lens array using a reflow process. Each micro-lens is formed with a minimum distance, typically no less than 0.3 microns, between adjacent micro-lenses. Any closer than 0.3 micrometers may cause two neighboring micro-lenses to bridge during reflow. In the known process, each micro-lens is patterned as a single square with gaps around it. During the reflowing of the patterned square micro-lenses, they form a gel drop in a partially spherical shape driven by the force equilibrium of surface tension and gravity. The micro-lenses then harden in this shape. If the gap between two adjacent gel drops is too narrow, they may touch and merge, or bridge, into one larger drop. The effect of bridging is that it changes the shape of the lenses, which leads to a change in focal length, or more precisely the energy distribution in the focal range. A change in the energy distribution in the focal range leads to a loss in quantum efficiency of and enhanced cross-talk between pixels. The gaps, however, allow unfocused photons through the empty spaces in the micro-lens array, leading to increased cross-talk between respective photosensors of adjacent pixel cells.

It is desired to form a micro-lens array having differently sized micro-lenses. If the known techniques, which use a single reflow step, were used to form such micro-lenses, the differently sized micro-lenses would have different focal lengths, which would lead to poor focusing at certain photosensors or to the need to modify the locations of some photosensors.

It is desirable to enhance the amount of light received from the micro-lenses to the photosensors of an imager. It is also desirable to form a micro-lens array with varied sized micro-lenses, each having a focal length optimized for the color or wavelength of light it is detecting.

SUMMARY

Embodiments of the present invention provide an improved micro-lens array. In one exemplary micro-lens array embodiment, the micro-lens array includes a first set of micro-lenses comprising a plurality of first micro-lenses each having a first size, and a second set of micro-lenses comprising a plurality of second micro-lenses each having a second size. The sizes of at least one of the first micro-lenses may be different from the sizes of at least one of the second micro-lenses. The micro-lens array has little to approximately no space between at least one pair of adjacent micro-lenses.

An exemplary semiconductor-based imager embodiment includes a pixel array and a micro-lens array. The pixel array has embedded pixel cells, each with a photosensor. The micro-lens array has at least one row of micro-lenses which includes a first set of micro-lenses comprising a plurality of first micro-lenses each having a first size, and a second set of micro-lenses comprising a plurality of second micro-lenses each having a second size, different from the first size. The second set of micro-lenses are arranged among the first set of micro-lenses. The micro-lens row has little to approximately no space between adjacent micro-lenses.

In an exemplary fabrication embodiment, a method is provided for manufacturing a micro-lens array. The method includes the acts of patterning a first set of micro-lens material onto a support, reflowing the first set of micro-lens material under first reflow conditions, curing the first set of micro-lens material to form a first set of micro-lenses including a plurality of first micro-lenses, patterning a second set of micro-lens material onto the support, reflowing the second set of micro-lens material under second reflow conditions, which may be different from the first conditions, and curing the second set of micro-lens material to form a second set of micro-lenses including a plurality of second micro-lenses.

These and other features of the various embodiments of the invention will be more readily understood from the following detailed description of the invention which is provided in connection with the accompanying drawings.

DETAILED DESCRIPTION OF PREFERRED EMBODIMENTS

Figure 1:
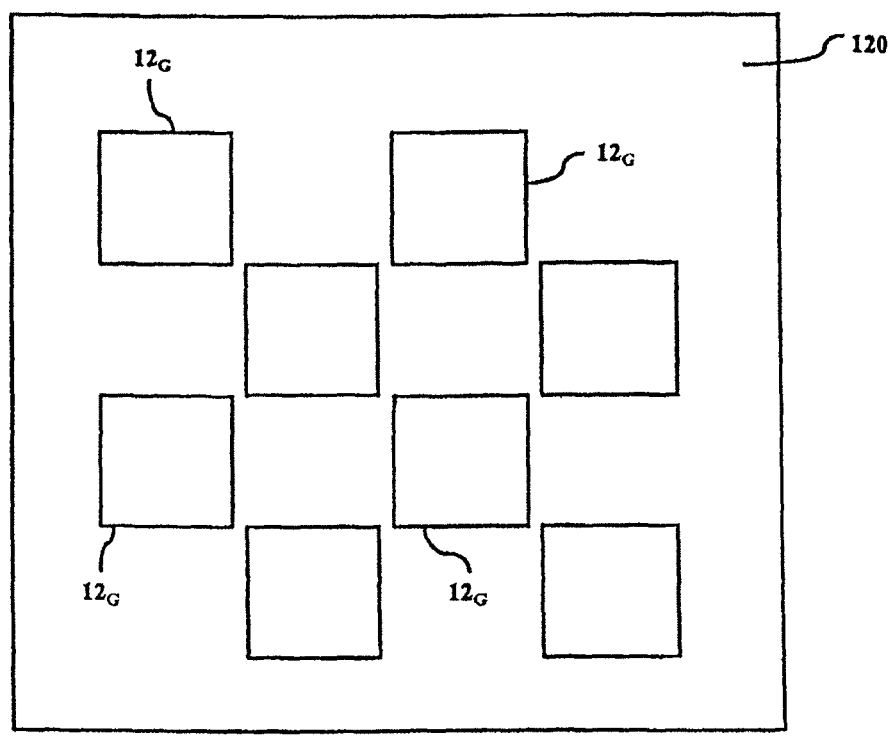
FIG. 1 is a top view of an array of micro-lens material deposited on a substrate in accordance with an exemplary embodiment of the invention.

In the following detailed description, reference is made to the accompanying drawings, which form a part hereof and show by way of illustration specific embodiments in which the invention may be practiced. These embodiments are described in sufficient detail to enable those skilled in the art to practice the invention, and it is to be understood that other embodiments may be utilized, and that structural, logical, and electrical changes may be made without departing from the spirit and scope of the present invention. The progression of processing steps described is exemplary of embodiments of the invention; however, the sequence of steps is not limited to that set forth herein and may be changed as is known in the art, with the exception of steps necessarily occurring in a certain order.

The term "wafer" or "substrate," as used herein, is to be understood as including silicon, silicon-on-insulator (SOI) or silicon-on-sapphire (SOS) technology, doped and undoped semiconductors, epitaxial layers of silicon supported by a base semiconductor foundation, and other semiconductor structures. Furthermore, when reference is made to a "wafer" or "substrate" in the following description, previous processing steps may have been utilized to form regions, junctions, or material layers in or over the base semiconductor structure or foundation. In addition, the semiconductor need not be silicon-based, but could be based on silicon-germanium, germanium, gallium arsenide or other semiconductors.

The term "pixel," as used herein, refers to a photo-element unit cell containing a photosensor device and associated structures for converting photons to an electrical signal. For purposes of illustration, a single representative three-color pixel and its manner of formation is illustrated in the figures and description herein; however, typically fabrication of a plurality of like pixels proceeds simultaneously. Accordingly, the following detailed description is not to be taken in a limiting sense, and the scope of the present invention is defined only by the appended claims.

Finally, while the invention is described with reference to a semiconductor-based imager, such as a CMOS imager, it should be appreciated that the invention may be applied in any micro-electronic or micro-optical device that requires high quality micro-lenses for optimized performance. Other exemplary micro-optical devices which can employ the invention include CCDs and display devices, as well as others.

Referring now to FIGS. 1-7, an array of micro-lenses 110 (FIG. 6) is shown. The array 110 includes a plurality of first micro-lenses $112_G$, a plurality of second micro-lenses $112_B$, and a plurality of third micro-lenses $112_R$, each plurality formed on a substrate 120. The first micro-lenses $112_G$ are formed for green color pixels, the second micro-lenses $112_B$ are formed for blue color pixels, and the third micro-lenses $112_R$ are formed for red color pixels. The second micro-lenses $112_B$ are shown (FIGS. 4-7) to have a larger size and a larger surface area than the first micro-lenses $112_G$.

Each of the first micro-lenses $112_G$ can be formed to have a focal length of similar length as the focal lengths of the second micro-lenses $112_E$ and the third micro-lenses $112_R$. Alternatively, micro-lenses $112_G$, $112_B$, and $112_R$ can be formed to have different focal lengths. As is known in the art, different wavelengths of light are absorbed at different depths within a photosensor. Therefore, micro-lenses $112_G$, $112_B$, and $112_R$ can be formed having a focal length optimized for the wavelength of light to be absorbed, e.g., green, blue, and red, respectively. In such a case, micro-lenses $112_B$ can be formed having a focal length corresponding to approximately a top surface of an underlying photosensor, micro-lenses $112_R$ can be formed having a focal length corresponding to a greater depth within an underlying photosensor, for example, approximately between 2 micrometers (μ) to 3μ deep, and micro-lenses $112_G$ can be formed having a focal length corresponding to an intermediate depth within an underlying photosensor between that of micro-lenses $112_B$ and $112_R$.

The second micro-lenses $112_B$ and the third micro-lenses $112_R$, as shown, abut the first micro-lenses $112_G$, thereby reducing the amount of space of the substrate 120 not covered by a micro-lens. Light transmitted directly through the substrate 120 without going through a micro-lens is not properly focused relative to any pixel cells, and may increase the incidence of cross-talk between pixel cells.

The first micro-lenses $112_G$ are formed from a first micro-lens material $12_G$. The first micro-lens material $12_G$ (FIG. 1) is deposited and patterned upon the support substrate 120. The substrate 120 is formed of any suitable material which is transparent to electromagnetic radiation. Each deposition of the first micro-lens material $12_G$ has a substantially rectangular configuration and each is substantially equal in size with the others. The first micro-lens material $12_G$ is a material which, upon reflow, forms into a solidly cross-linked polymer impervious to subsequent reflow processes. During a reflow process conducted under reflow conditions, the substantially rectangular configuration of the first micro-lens material $12_G$ is transformed into the first micro-lens $112_G$, which has a somewhat rectangular configuration with rounded edges and a curved top. The first micro-lenses $112_G$, which are transparent to electromagnetic radiation, will retain their shape even if a subsequent reflow process is performed.

Figure 2:
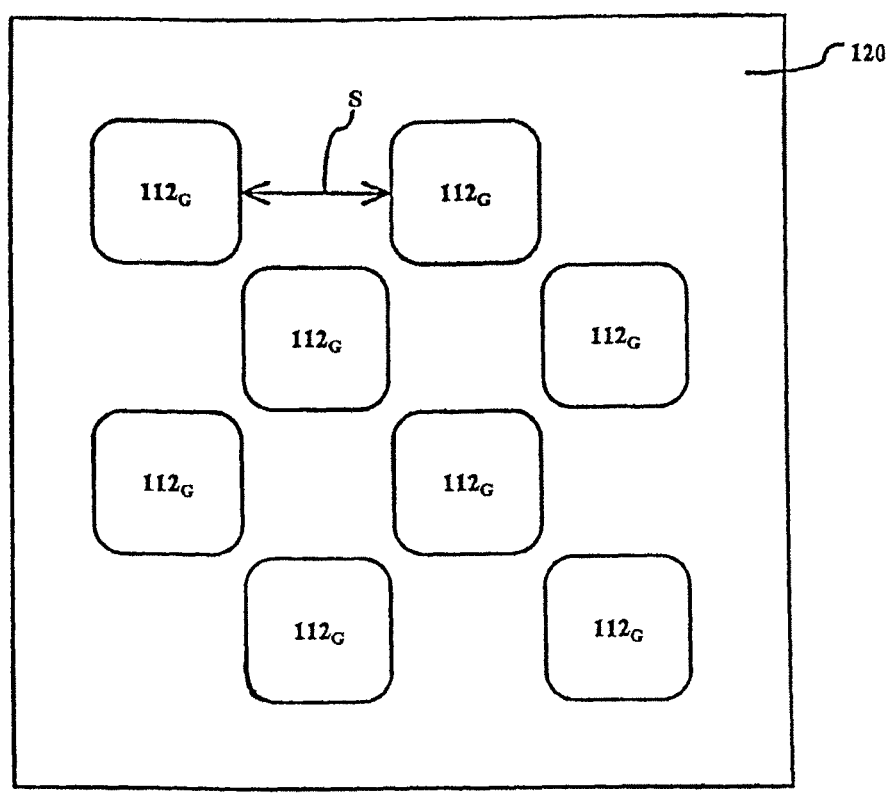
FIG. 2 is a top view of an array of micro-lenses reflowed and cured from the micro-lens material of FIG. 1.
Figure 3:
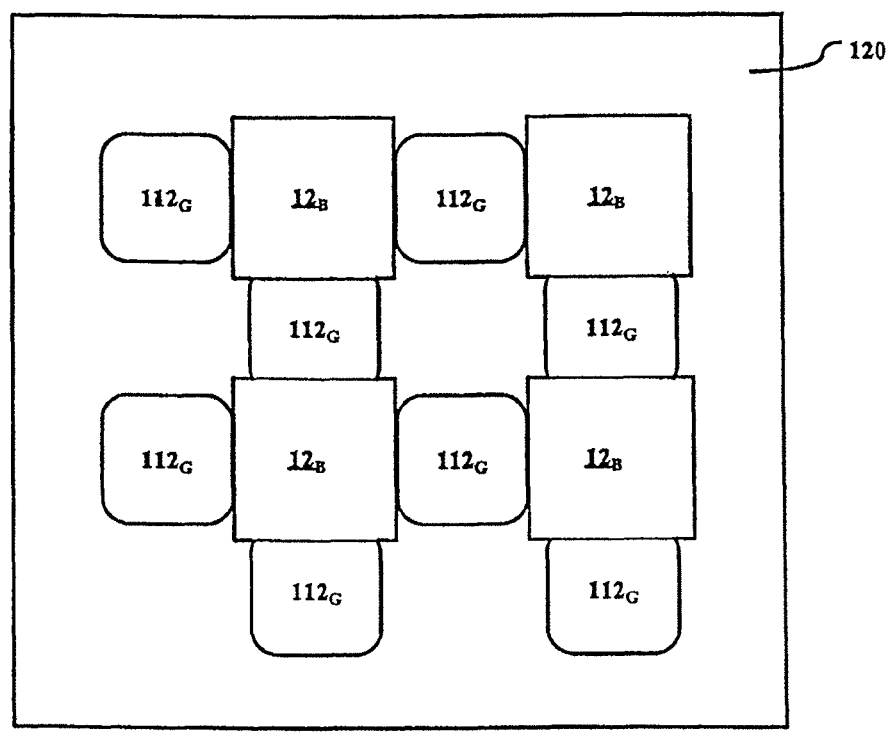
FIG. 3 is a top view of a second array of micro-lens material deposited adjacent to the micro-lenses of FIG. 2.

As shown in FIG. 2, there are spaces S between the micro-lenses $112_G$. After patterning and reflowing the first micro-lens material $12_G$ to form the first solidly cross-linked polymer micro-lenses $112_G$, a second micro-lens material $12_B$ (FIG. 3) is patterned and reflowed on the substrate 120. The second micro-lens material $12_B$, patterned in a substantially rectangular configuration, is positioned in some of the spaces S between the first micro-lenses $112_G$. Additionally, portions of second micro-lens material $12_B$ can be formed overlapping the first micro-lenses $112_G$.

Figure 4:
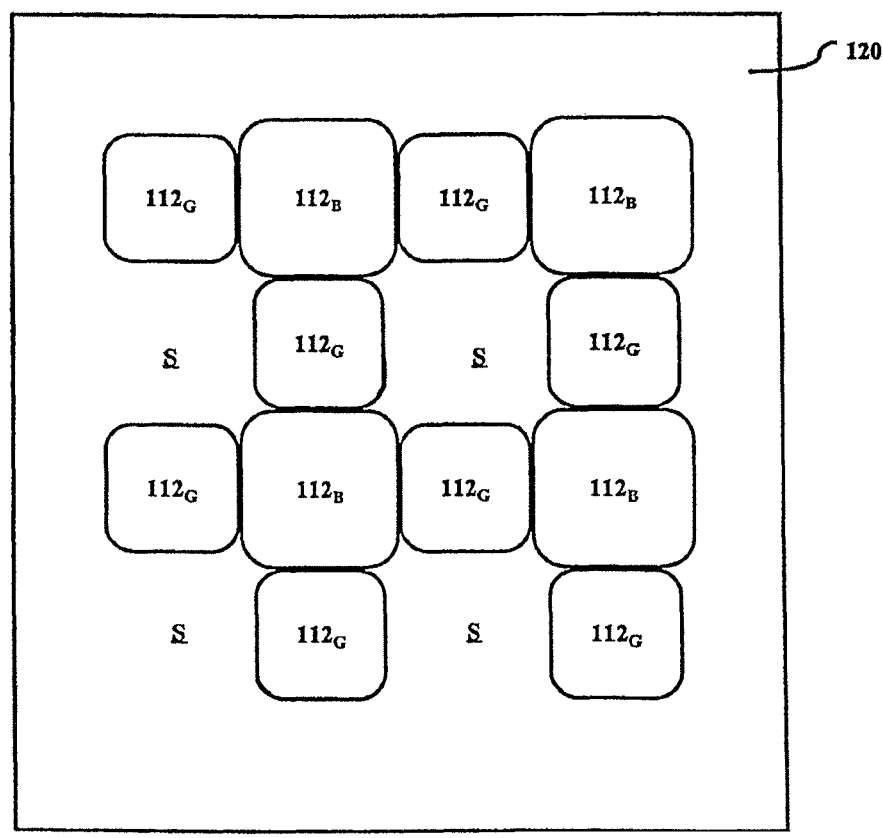
FIG. 4 is a top view of a second array of micro-lenses reflowed and cured from the second micro-lens material of FIG. 3.

Reflowing and curing of the second micro-lens material $12_B$ under reflow conditions, which may differ from the conditions of the reflow of the first micro-lens material $12_G$, forms second micro-lenses $112_B$, as shown in FIG. 4. The second micro-lenses $112_B$ are impervious to subsequent reflow, just like the first micro-lenses $112_G$. The second micro-lenses $112_B$, which are of a different size than the first micro-lenses $112_G$, specifically, a larger size, are each somewhat rectangular in configuration with rounded corners and a curved top. More particularly, the second micro-lenses $112_B$ have a similar curvature, a greater volume, and a larger surface area than the first micro-lenses $112_G$. It should be appreciated that instead, the first micro-lenses $112_G$ may be larger than the second micro-lenses $112_B$.

Figure 5:
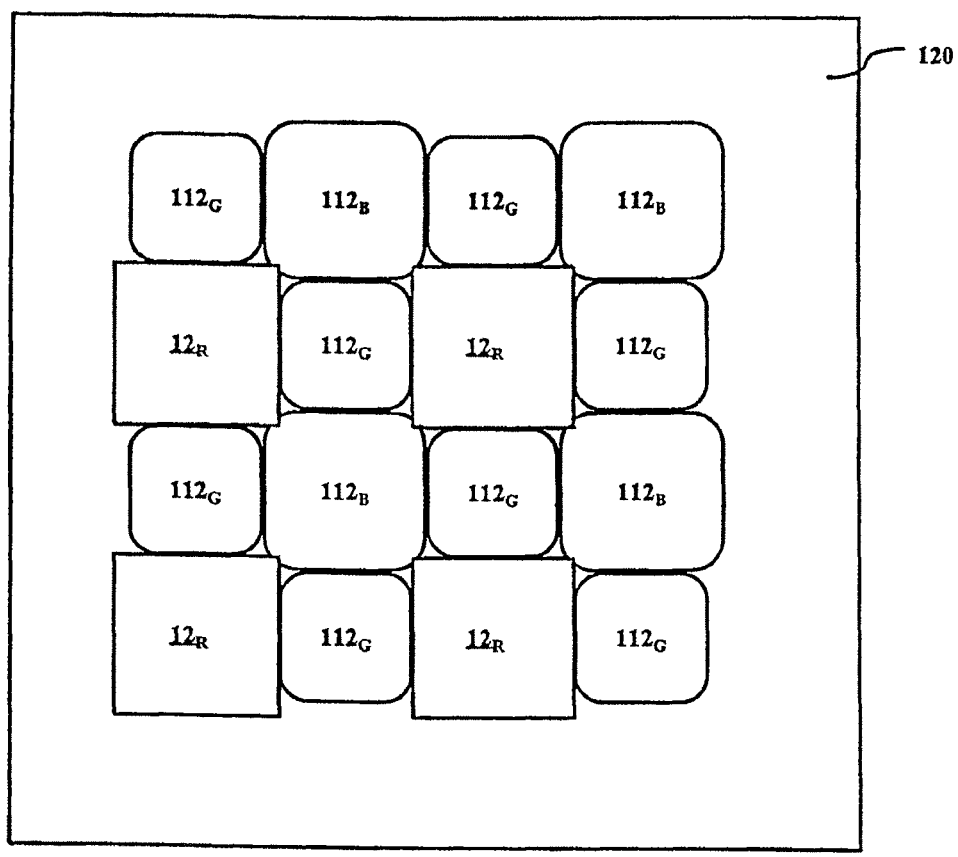
FIG. 5 is a top view of a third array of micro-lens material deposited adjacent to the micro-lenses of FIGS. 2 and 3.
Figure 6:
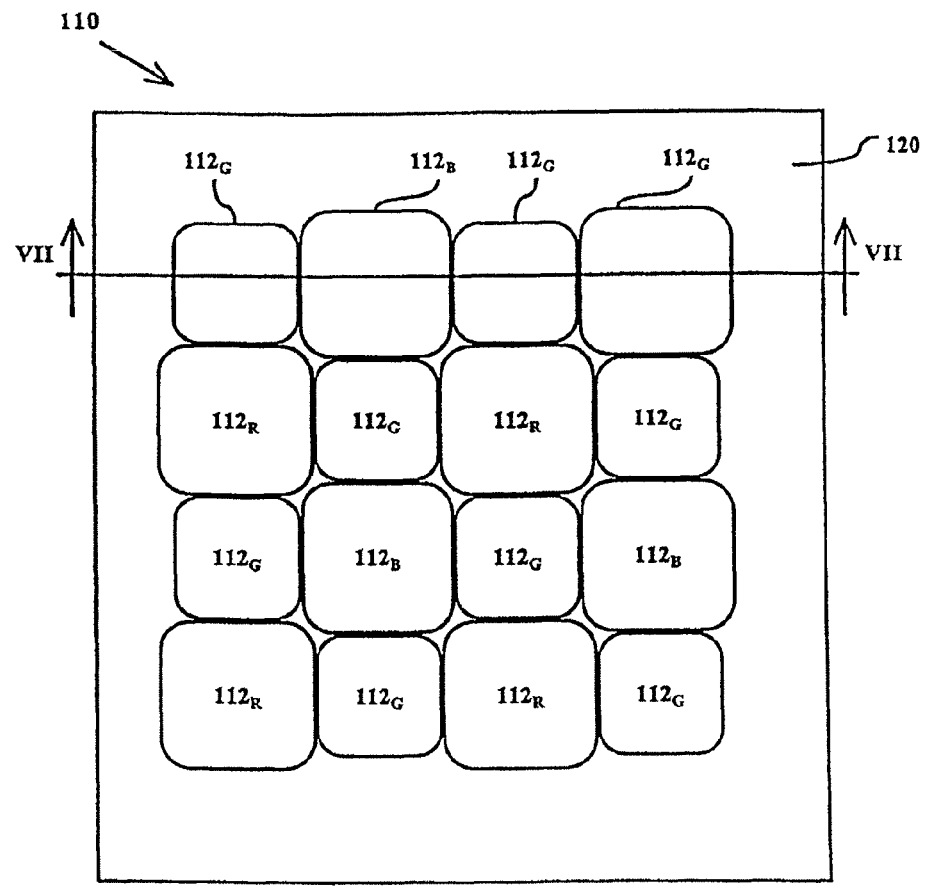
FIG. 6 is a top view of a third array of micro-lenses reflowed and cured from the third micro-lens material of FIG. 5.

As will be apparent from a review of FIG. 4, spaces S remain among the first and second micro-lenses $112_G$, $112_B$. In those spaces S, a third micro-lens material $12_R$ is patterned and reflowed (FIG. 5). As with the other micro-lens material $12_G$, $12_B$ patterns, the third micro-lens material $12_R$ pattern is substantially rectangular. Also, the third micro-lens material $12_R$ can overlap micro-lenses $112_G$ and/or $112_B$. After a third reflow process and cure utilizing reflow conditions, which may differ from either of the first two reflows and cures, third micro-lenses $112_R$ are formed, which are each somewhat rectangular in configuration with rounded corners and a curved top (FIG. 6).

The micro-lenses $112_G$, $112_B$, $112_R$ are formed, sized and configured so as to present a focal length down to a focal plane 122. As noted above, micro-lenses $112_G$, $112_B$, $112_R$ can be formed having a same focal length or a focal length for a particular color of light, specifically green, blue, and red, respectively. It should be appreciated that instead, the micro-lenses $112_G$, $112_B$, $112_R$ may be formed, sized and configured to present a focal length to the focal plane 122 for the colors of cyan, magenta, and yellow, or any other suitable combination of colors.

A micro-lens array 110 is thus formed, and includes any combination of two or more micro-lenses $112_G$, $112_B$, $112_R$. By fabricating the micro-lens array 110 in this way, forming first micro-lenses $112_G$ spaced apart, e.g., in a checkerboard fashion, and filling in the spaces S with second and third micro-lenses $112_B$, $112_R$ formed in separate processes, bridging between adjacent first micro-lenses $112_G$ and between first, second, and third micro-lenses $112_G$, $112_B$, $112_R$ is diminished. This is because the first micro-lenses $112_G$ have already gone through a reflow process that has rendered them impervious to any subsequent reflow process. Thus, the subsequent reflow of the second micro-lens material $12_B$ into the second micro-lenses $112_B$ will not cause bridging between the first and second micro-lenses $112_G$, $112_B$ or between a pair of second micro-lenses $112_B$. Likewise, the subsequent reflow of the third micro-lens material $12_R$ into the third micro-lenses $112_R$ will not cause bridging between the first and third micro-lenses $112_G$, $112_R$, between the second and third micro-lenses $112_B$, $112_R$, or between a pair of third micro-lenses $112_R$. The micro-lens array 110 is approximately space-less since the formed micro-lenses abut one another.

It should be appreciated that the second and third micro-lenses $112_B$, $112_R$ may be formed in a single reflow process. Since second and third micro-lenses $112_B$, $112_R$ are spatially separated from one another, bridging is not likely.

Figure 7:
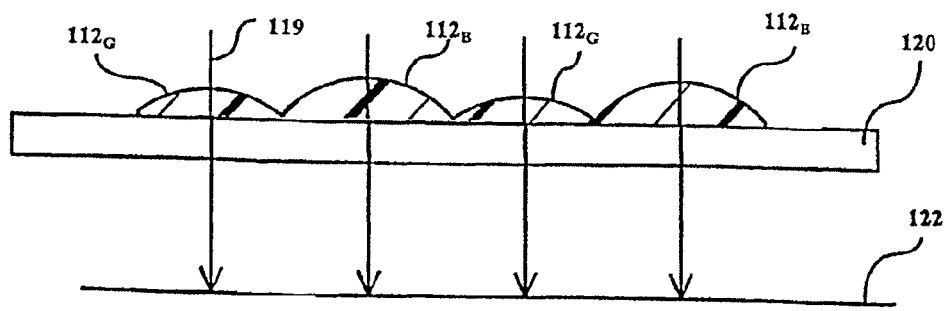
FIG. 7 is a cross-sectional view taken along line VII-VII of FIG. 6.

Referring particularly to FIG. 7, electromagnetic radiation 119 transmitted through the micro-lenses $112_G$, $112_B$, and $112_R$ (the latter is not shown in the FIG. 7 cross-section). As shown, each of the micro-lenses $112_G$ has a different volume than each of the micro-lenses $112_B$ and $112_R$. However, the micro-lenses $112_G$, $112_B$, and $112_R$ each can be shaped, configured, and conditioned during reflow to create a focal point that extends down to the focal plane 122, as shown in FIG. 7. Also, the micro-lenses $112_G$, $112_B$, and $112_R$ each can be shaped, configured, and conditioned during reflow to create different focal points, which can be optimized for a particular wavelength or color.

By forming the micro-lenses $112_G$, $112_B$, and $112_R$ through separate reflow processes, the micro-lens array 110 can be formed to provide greater signal strength for pixels that would conventionally exhibit a lower signal. For example, blue color pixels tend to produce an inherently lower output signal for a given light intensity. Thus, the micro-lens array 110 can be formed by creating larger micro-lenses, such as the second and third micro-lenses $112_B$, $112_R$ for the blue and red color pixels, which will collect more light and help balance pixel signal strength for the different color pixels of a pixel array. A balanced signal between colors assists the dynamic range of the photosensors in pixel cells because it avoids systematically sending pixels of one color into saturation while other pixels are only partially saturated.

Figure 8:
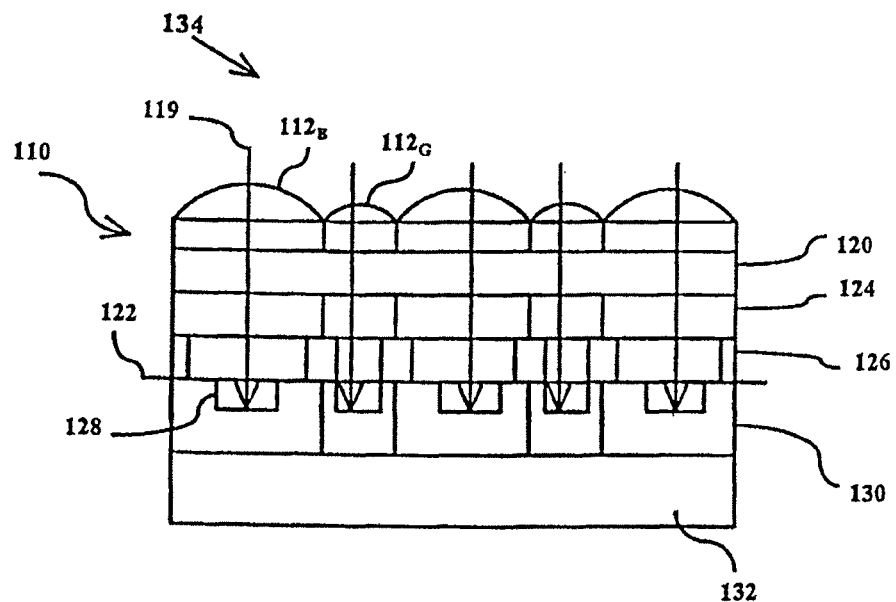
FIG. 8 illustrates a semiconductor-based imager constructed in accordance with an exemplary embodiment of the invention.

Referring now to FIG. 8, there is shown a semiconductor-based imager 134, such as a CMOS imager. The imager 134 includes the micro-lens array 110, with the micro-lenses $112_G$, $112_B$, and $112_R$ (not shown), the substrate 120, a color filter array 124, a light shield 126, and pixel cells 130 embedded within a wafer 132. Each pixel cell 130 includes a photosensor 128. As shown in FIG. 8, the micro-lenses $112_G$, $112_B$, and $112_R$ are shaped and configured so that their focal lengths coincide with the focal plane 122, which runs through the photosensors 128. Alternatively, the micro-lenses $112_G$, $112_B$, and $112_R$ can be shaped and configured so that each of micro-lenses $112_G$, $112_B$, and $112_R$ have focal lengths corresponding to different wavelengths of light.

Figure 9:
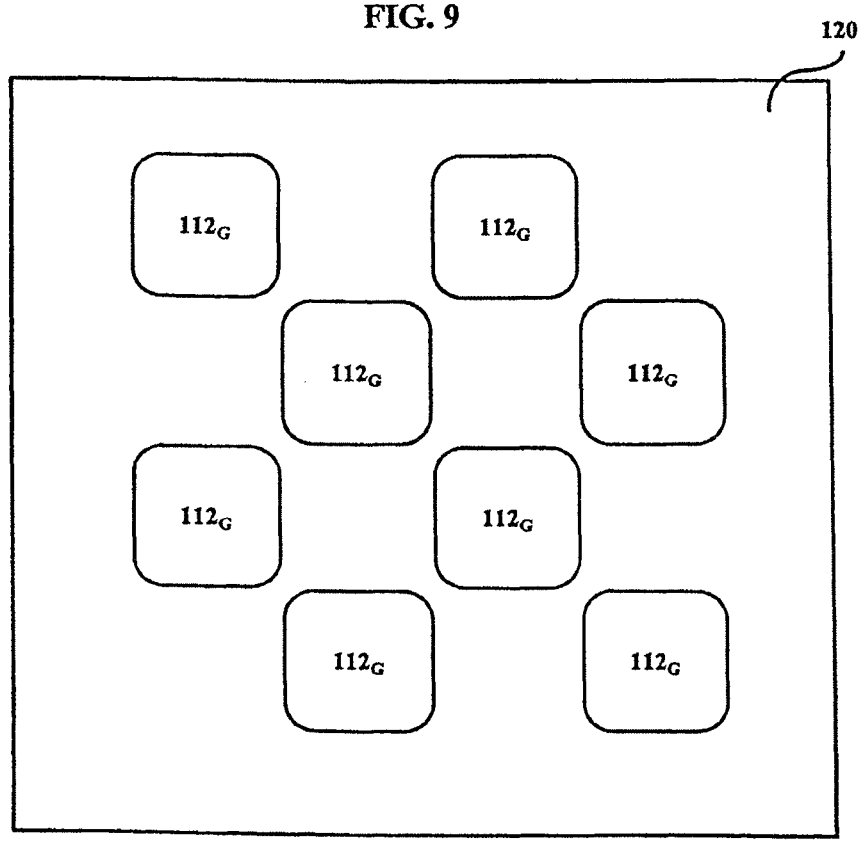
FIGS. 9-11 illustrate the formation of a micro-lens array in accordance with another exemplary embodiment of the invention.
Figure 10:
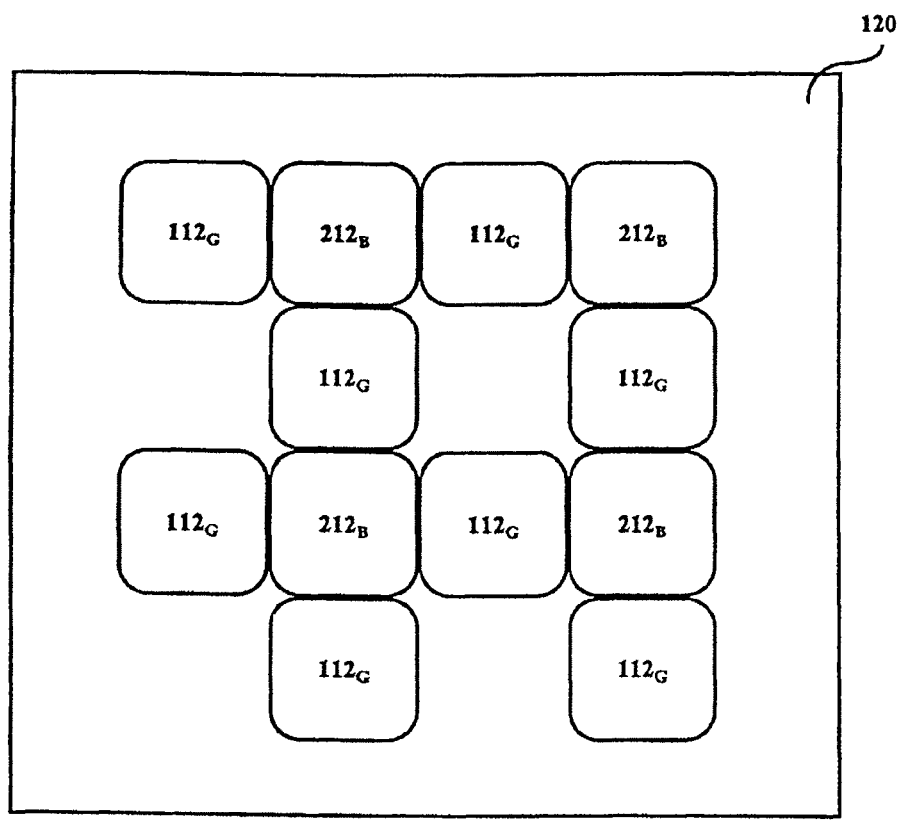
Figure 11:
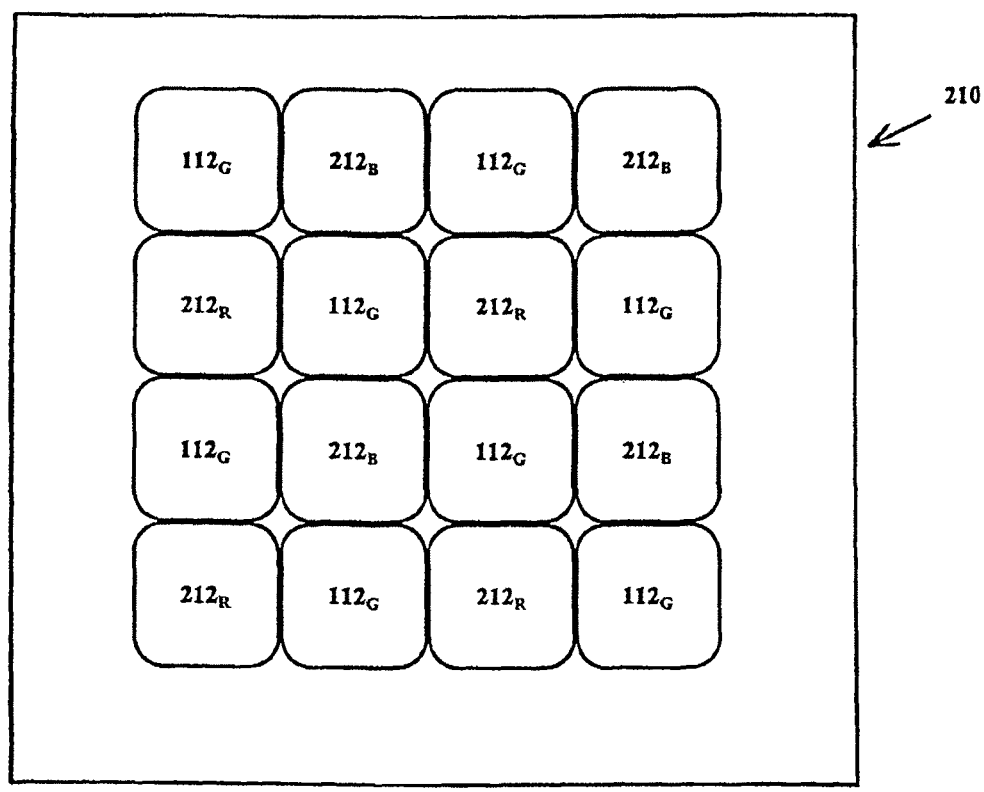

With reference to FIGS. 9-11, next will be described the formation of a micro-lens array 210 having similarly shaped micro-lenses that are formed in three separate pattern and reflow procedures. A first set of micro-lens material is deposited and patterned on the substrate 120. The first micro-lens material is subjected to a first reflow process and is cured to form the first micro-lenses $112_G$. As is shown in FIG. 9, the micro-lenses $112_G$ are spaced apart from one another.

Then, a second micro-lens material with a different thickness is deposited and patterned on the substrate 120 in some of the spaces between the first micro-lenses $112_G$. Subjecting the micro-lens array to a second reflow process converts the second micro-lens material depositions into second micro-lenses $112_B$ (FIG. 10). If needed, the second reflow process may be conducted under different conditions than the first reflow process.

Finally, a third micro-lens material is deposited and patterned on the substrate in other of the spaces among the first and second micro-lenses $112_G$, $112_B$. A third reflow converts the third micro-lens material patterns into third micro-lenses $112_R$ (FIG. 11). If needed, the third reflow process may be conducted under different conditions than the first and/or second reflow processes. While described in terms of three separate reflow processes, it should be understood that the second and third micro-lenses $112_B$, $112_R$ may be formed together in a single reflow process, since these micro-lenses are separated from one another and the likelihood of bridging is minimized.

As shown in FIG. 11, the micro-lens array 210 is approximately space-less, meaning that there is little to no space on the micro-lens array 210 between adjacent micro-lenses $112_G$, $112_B$, $112_R$ through which unfocussed light can be transmitted.

An example of reflow conditions are described next. The shape of the micro-lenses after being subjected to reflow conditions is defined by several factors, including the thickness and type of material used to form the micro-lenses, the reflow temperature profile, and any pretreatment of the material that changes its glass transition temperature $T_g$. Examples of such pretreatments include ultraviolet light exposure or preheating the material to a temperature below the glass transition temperature $T_g$. An example of first reflow conditions may include providing first micro-lens material at a first thickness and from a first type of material, exposing the first micro-lens material with an ultraviolet light flood exposure of a specific dose, and reflowing at a first temperature ramp rate, followed by a cure. Second reflow conditions may include providing second micro-lens material of the first type of material at a second thickness and reflowing the second micro-lens material with the first temperature ramp rate, followed by a cure. Third reflow conditions may include providing a third micro-lens material of a second material type and of a third thickness, pre-heating the material to a temperature below the transition glass temperature $T_g$ of the third micro-lens material for a set period of time, and then reflowing at a second temperature ramp rate, followed by a cure.

Figure 12:
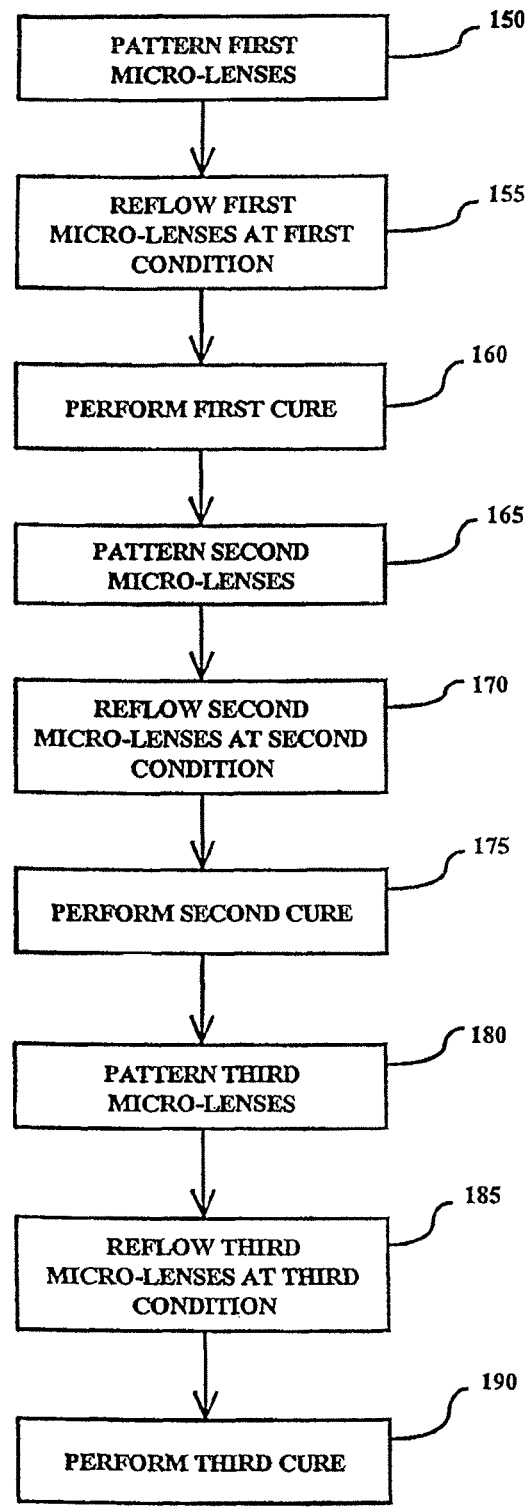
FIG. 12 illustrates a process for fabricating the micro-lens array of FIG. 6.

Next will be described a process for forming the micro-lens array 110 with reference to FIG. 12. At Step 150, the first micro-lens material $12_G$ is patterned on the substrate 120. The patterning, as described above, can be a checkerboard pattern, which includes spaces between portions of the first micro-lens material $12_G$. A single reticle may be used to prepare each of the first micro-lens material $12_G$ patterns. In the patterning step, a thin film of micro-lens material of a first thickness is coated on the substrate, the material is exposed using a suitable mask, and it is developed to either dissolve the exposed micro-lens material (positive resist) or dissolve the unexposed micro-lens material (negative resist). At Step 155, the first micro-lens material $12_G$ is reflowed at a first condition. Reflowing of the first micro-lens material $12_G$ turns the material into the first micro-lenses $112_G$. At Step 160, the micro-lenses $112_G$ are cured, thus forming a checkerboard pattern of solidly cross-linked first micro-lenses $112_G$.

At Step 165, the second micro-lens material $12_B$ is patterned on the substrate 120 in some of the spaces between the first micro-lenses $112_G$. A single reticle may be used to prepare each of the second micro-lens material $12_B$ depositions. If the second micro-lens material $12_B$ patterns are of the same size as the first micro-lens material $12_G$ patterns (as described with reference to FIGS. 9 and 10), the same reticle as was used for the pattern of the first micro-lens material $12_G$ patterns may be used for the pattern of the second micro-lens material patterns $12_B$. For the pattern of the second micro-lens material $12_B$, the reticle is shifted in the stepper job.

At Step 170, the second micro-lens material $12_B$ may be reflowed at a second condition to form the second micro-lenses $112_B$. The second condition may differ from the first condition, for example, by varying the exposure and/or the dose of bleaching or the step baking temperature. By using different reflow conditions, the first micro-lenses $112_G$ and second micro-lenses $112_B$ can be formed having same or different focal lengths. At Step 175, a second cure is performed.

At Step 180, third micro-lens material $12_R$ is patterned in remaining open spaces between the micro-lenses $112_G$, $112_B$. At Step 185, the third micro-lens material $12_R$ may be reflowed at a third condition to form the third micro-lenses $112_R$. The third condition may differ from the first and second conditions, for example, by varying the doses of exposing and/or bleaching or the step baking temperature. By using different reflow conditions, the third micro-lenses $112_R$ can be formed such that their focal lengths are the same or different than the focal lengths of the first and second micro-lenses $112_G$, $112_B$. At Step 190, a third cure is performed.

While the invention has been described in detail in connection with exemplary embodiments known at the time, it should be readily understood that the invention is not limited to such disclosed embodiments. Rather, the invention can be modified to incorporate any number of variations, alterations, substitutions or equivalent arrangements not heretofore described, but which are commensurate with the spirit and scope of the invention. For example, while the micro-lens arrays 110, 210 are shown with micro-lenses abutting one another, since multiple reflow processes are performed, subsequently formed micro-lenses can overlap previously formed micro-lenses. Furthermore, instead of three reflow processes, only two reflow processes may be performed, or more than three reflow processes may be performed. Accordingly, the invention is not to be seen as limited by the foregoing description, but is only limited by the scope of the appended claims.

What is claimed as new and desired to be protected by Letters Patent of the United States is:

1. A method of forming a micro-lens array, comprising:
   patterning a first set of micro-lens material onto a substrate;
   reflowing the first set of micro-lens material under first reflow conditions;
   curing the first set of micro-lens material to form a plurality of first micro-lenses;
   patterning a second set of micro-lens material onto the substrate;
   reflowing the second set of micro-lens material under second reflow conditions that are different than the first reflow conditions;
   curing the second set of micro-lens material to form a plurality of second micro-lenses; and
   wherein the second reflow conditions differ from the first reflow conditions in one or more of an exposure of the micro-lens material, a bleaching dosage of the micro-lens material, and a pre-treatment of the micro-lens material to change its glass transition temperature.

2. The method of claim 1, wherein said first reflow conditions are chosen to create a focal length in said first micro-lenses that is substantially equal to a focal length in said second micro-lenses.

3. The method of claim 1, wherein said first reflow conditions are chosen to create a focal length in said first micro-lenses corresponding to a first wavelength of light, and said second reflow conditions are chosen to create a focal length in said second micro-lenses corresponding to a second wavelength of light.

4. The method of claim 1, wherein patterning a first set of micro-lens material comprises patterning the first set of micro-lens material into a first plurality of portions arranged in a checkerboard pattern, the checkerboard pattern including spaces between said portions.

5. The method of claim 4, wherein patterning a second set of micro-lens material comprises patterning the second set of micro-lens material into a second plurality of portions in a complementary checkerboard pattern filling in spaces between respective portions of the plurality of portions of the first set of micro-lens material.

6. The method of claim 5, wherein patterning a second set of micro-lens material comprises patterning the second set of micro-lens material overlapping said first micro-lenses.

7. The method of claim 5, wherein said second plurality of portions comprises portions having a size no smaller than the size of the portions in the first plurality of portions.

8. The method of claim 1, further comprising:
   patterning a third set of micro-lens material onto the substrate;
   reflowing the third set of micro-lens material under third reflow conditions; and
   curing the third set of micro-lens material to form a third set of micro-lenses including a plurality of third micro-lenses.

9. The method of claim 8, wherein the patternings and reflow conditions of said first set, second set, and third set of micro-lens material create a micro-lens array having substantially no space between adjacent micro-lenses.

10. The method of claim 8, further comprising reflowing the third micro-lens material under third reflow conditions that are different than the first reflow conditions.

11. The method of claim 8, further comprising reflowing the third micro-lens material at a same time as reflowing the second micro-lens material.

12. The method of claim 8, wherein the third micro-lens material has a different thickness than the first micro-lens material.

13. The method of claim 8, wherein the third set of micro-lenses has a different focal length than the first set of micro-lenses.

14. The method of claim 1, wherein patterning a second set of micro-lens material comprises patterning the second set of micro-lens material to abut but not overlap said first micro-lenses.

15. The method of claim 1, wherein the second reflow conditions comprise a different pretreatment than the first reflow conditions.

16. The method of claim 1, wherein the second reflow conditions comprise a different bleaching dosage than the first reflow conditions.

17. The method of claim 1, wherein the first set of micro-lenses has a different focal length than the second set of micro-lenses.

18. The method of claim 1, wherein the micro-lens material of the first set of micro-lens material is of a different material type than the second set of micro-lens material.

19. The method of claim 1, wherein the first set of micro-lens material has a different thickness than the second set of micro-lens material.

20. The method of claim 1 wherein the first and second sets of micro-lens material are of the same material type.

21. The method of claim 1 wherein the micro-lens material of the second set have different surface areas from the micro-lens material of the first set.

22. The method as in claim 1 wherein the first and second sets of micro-lenses are formed over respective color filters.

23. A method of forming an imager comprising:
forming a plurality of pixels on a substrate; and
forming a micro-lens array having a predetermined pattern over the plurality of pixels, wherein forming the micro-lens array comprises:
depositing a first micro-lens material;
patterning the first micro-lens material to form a first pattern;
reflowing the first micro-lens material under first reflow conditions to form a first set of micro-lenses having a first focal length;
depositing a second micro-lens material;
patterning the second micro-lens material to form a second pattern;
reflowing the second micro-lens material under second reflow conditions that are different than the first reflow conditions to form a second set of micro-lenses having a second focal length; and
wherein the second reflow conditions differ from the first reflow conditions in one or more of an exposure of the micro-lens material, a bleaching dosage of the micro-lens material, and a pre-treatment of the micro-lens material to change its glass transition temperature.

24. The method of claim 23, wherein forming the micro-lens array further comprises:
depositing a third micro-lens material;
patterning the third micro-lens material to form a third pattern; and
reflowing the third micro-lens material under third reflow conditions to form a third set of micro-lenses having a third focal length.

25. The method of claim 24, wherein the third reflow conditions are different than the first reflow conditions.

26. The method of claim 24, wherein the third reflow conditions are different than the second reflow conditions.

27. The method of claim 24, wherein reflowing the third micro-lens material is performed at the same time as reflowing the second micro-lens material.

28. The method of claim 24, wherein the first, second, and third sets of micro-lenses correspond to pixels for receiving different colored light.

29. The method of claim 23, wherein the second micro-lens material overlaps the first micro-lens material.

30. The method of claim 23, wherein the second micro-lens material abuts the first micro-lens material.

31. The method of claim 23, wherein depositing the second micro-lens material comprises depositing micro-lens material having a different thickness than the first micro-lens material.

32. The method of claim 23, wherein the first deposited micro-lens material has a different material type than the second deposited micro-lens material.

33. The method of claim 23, wherein the second reflow conditions comprise a different pretreatment than the first reflow conditions.

34. The method of claim 23, wherein the second reflow conditions comprise a different bleaching dosage than the first reflow conditions.

35. The method of claim 23, wherein the reflow conditions for forming the first and second micro-lenses causes the first micro-lenses to have a different depth of penetration of a focal length on or into respective underlying pixels than the depth of penetration of a focal length of the second micro lenses on or into respective underlying pixels.

* * * * *